United States Patent [19]
Tokuyama

[11] Patent Number: 5,481,549
[45] Date of Patent: Jan. 2, 1996

[54] APPARATUS FOR TESTING AN INTEGRATED CIRCUIT IN WHICH AN INPUT TEST PATTERN CAN BE CHANGED WITH AN SELECTED APPLICATION TIMING

[75] Inventor: Saburo Tokuyama, Yokohama, Japan

[73] Assignee: Fujitsu Limited, Kanagawa, Japan

[21] Appl. No.: 829,516

[22] Filed: Jan. 31, 1992

Related U.S. Application Data

[63] Continuation of Ser. No. 526,947, May 23, 1990, abandoned, which is a continuation of Ser. No. 187,136, Apr. 28, 1988, abandoned.

[30] Foreign Application Priority Data

Apr. 30, 1987 [JP] Japan .................................. 62-104545

[51] Int. Cl.$^6$ .................. G01R 31/3183; G01R 31/3193
[52] U.S. Cl. ............................................. 371/27; 371/25.1
[58] Field of Search ...................................... 371/27, 25.1

[56] References Cited

U.S. PATENT DOCUMENTS

| 4,335,457 | 6/1982 | Early ......................................... 371/28 |
| 4,517,661 | 5/1985 | Graf et al. ............................... 364/900 |

OTHER PUBLICATIONS

Scala, K., "Flexible System Tests RAMs Using Very Precise Signals", *Electronics*, Dec. 4, 1980, pp. 132–136.

Primary Examiner—Stephen M. Baker
Attorney, Agent, or Firm—Nikaido, Marmelstein, Murray & Oram

[57] ABSTRACT

An apparatus for testing an integrated circuit includes a clock generator; a first memory for storing at least one instruction data, and a second memory for storing input data and corresponding expected output data employed in testing. A control unit controls the output of the input data and expected output data in accordance with the content of the instruction data. A counter counts clocks output from the generator. A register circuit stores at least one designated value. A comparing circuit outputs at least one control signal based on the comparison between the designed value and a value of the counter. A circuit defining a first timing data, representing a mode of application of a test pattern, and at least one second timing data, representing a mode of application different from the first timing data, outputs one of the first or second timing data in response to the control signal. A testing circuit applies the input data to the integrated circuit and compares a response signal from the integrated circuit with the expected output data, whereby it is determined whether the integrated circuit is functional or nonfunctional. By suitably changing the designated value in the register circuit, the mode of application of the test pattern can be easily changed when the test is carried out with an arbitrary test pattern, and at the same time, a change in writing into the second memory is made unnecessary. Thus, a more efficient test is realized.

12 Claims, 6 Drawing Sheets

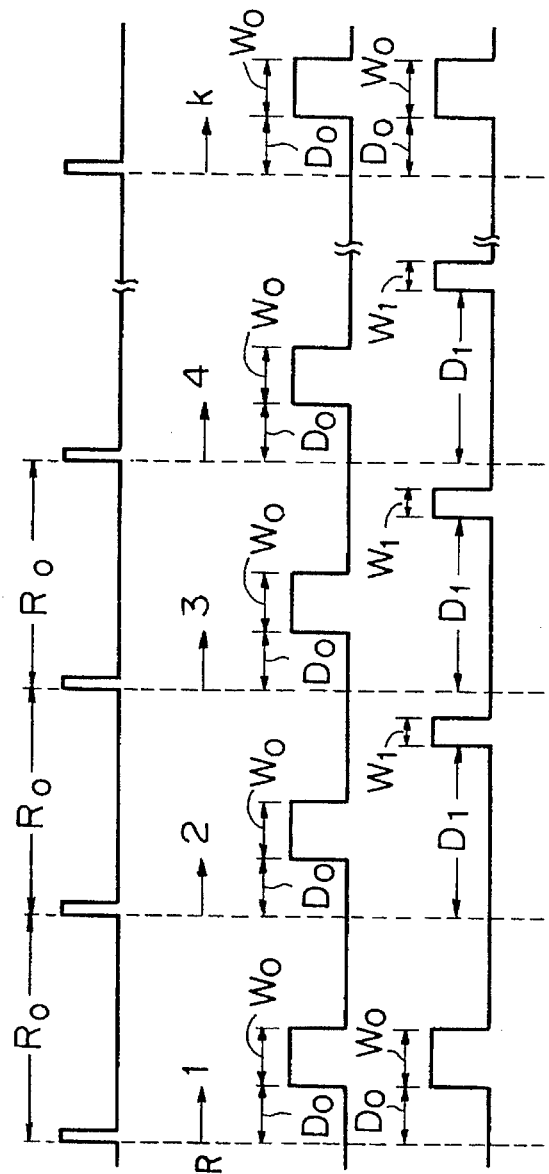

APPARATUS FOR TESTING AN INTEGRATED CIRCUIT IN WHICH AN INPUT TEST PATTERN CAN BE CHANGED WITH AN SELECTED APPLICATION TIMING

This application is a continuation of application Ser. No. 526,947 filed May 23, 1990, now abandoned, which is a continuation of application Ser. No. 187,136 filed Apr. 28, 1988 now abandoned.

BACKGROUND OF THE INVENTION

1. Field of the Invention

The present invention relates to an apparatus for testing an integrated circuit or a large scale integrated circuit, hereinafter referred to as an LSI tester, and more particularly, to an apparatus which applies predetermined input test data to an integrated circuit to be tested, hereinafter referred to as a D.U.T., i.e., Device Under Test, and compares a signal output from the D.U.T. in response to the input test data with a predetermined expected output test data, to determine whether the D.U.T. is functional or non-functional.

2. Description of the Related Art

A known typical LSI tester includes a buffer memory, in which input data for testing a D.U.T., corresponding expected output data, and timing changing bits for defining an application mode of the input data are stored. This apparatus is constituted in such a manner that a test of the D.U.T. is made in accordance with the timing changing bits preset with respect to each of addresses in the buffer memory. Namely, the application mode of the test pattern is fixedly defined based on the order in which the test pattern to be employed is stored in the buffer memory. Therefore, to change the application mode of the test pattern, the writing into the buffer memory must be inevitably changed, and further, to realize a variety of application modes, the capacity of the buffer memory must be increased.

Accordingly, the LSI tester of the prior art has disadvantages in that; first, it is impossible to freely change the application mode of the test pattern when the test is carried out with an arbitrary test pattern; second, since a change in writing into the buffer memory is necessary, the test cannot be efficiently carried out.

SUMMARY OF THE INVENTION

An object of the present invention is to provide an apparatus for testing an integrated circuit in which, when the circuit is tested with an arbitrary test pattern, an application mode of the test pattern can be freely changed.

Another object of the present invention is to provide an apparatus for testing an integrated circuit, by which a change in writing into a buffer memory becomes unnecessary, and thus the test-efficiency is improved.

The above-mentioned objects of the present invention are attained by providing, an apparatus for testing an integrated circuit, the apparatus including a clock generator for generating a train of clocks with a variable rate of generation; a first memory in which at least one instruction data is preset and stored; a second memory in which a plurality of input data and a corresponding plurality of expected output data are preset and stored; a control unit connected between the first memory and the second memory, for reading the instruction data from the first memory in response to each of the clocks output from the clock generator and causing the second memory to output the input data and the corresponding expected output data in accordance with the content of the instruction data; a counter for sequentially counting the clocks output from the clock generator, one by one; a register circuit in which at least one designated value is preset and stored; a comparator connected to the counter and the register circuit, for comparing the designated value in the register circuit with a value of the counter and outputting at least one control signal based on the result of the comparison; a timing data outputting circuit in which a first timing data representing a first application mode of a test pattern within a time interval defined by the variable rate and at least one second timing data representing a second application mode different from the first timing data are defined, for outputting any one of the first or second timing data in response to the control signal from the comparator; and a test circuit connected between the second memory and the integrated circuit to be tested, for applying the input data from the second memory to the integrated circuit based on the one of the first or second timing data and comparing a signal, output from the integrated circuit in response to the input data with the expected output data, corresponding to the input data, from the second memory, whereby a result of a determination of whether the integrated circuit is functional or non-functional is indicated.

BRIEF DESCRIPTION OF THE DRAWINGS

Other objects and features of the present invention will be described hereinafter in detail by way of preferred embodiments, with reference to the accompanying drawings in which;

FIGS. 6a to 6d are waveform diagrams for explaining an operation of the apparatus shown in FIG. 5.

DESCRIPTION OF THE PREFERRED EMBODIMENTS

For a better understanding of the preferred embodiments, the problems of the prior art will now be explained with reference to FIGS. 1 and 2.

Figure 1:
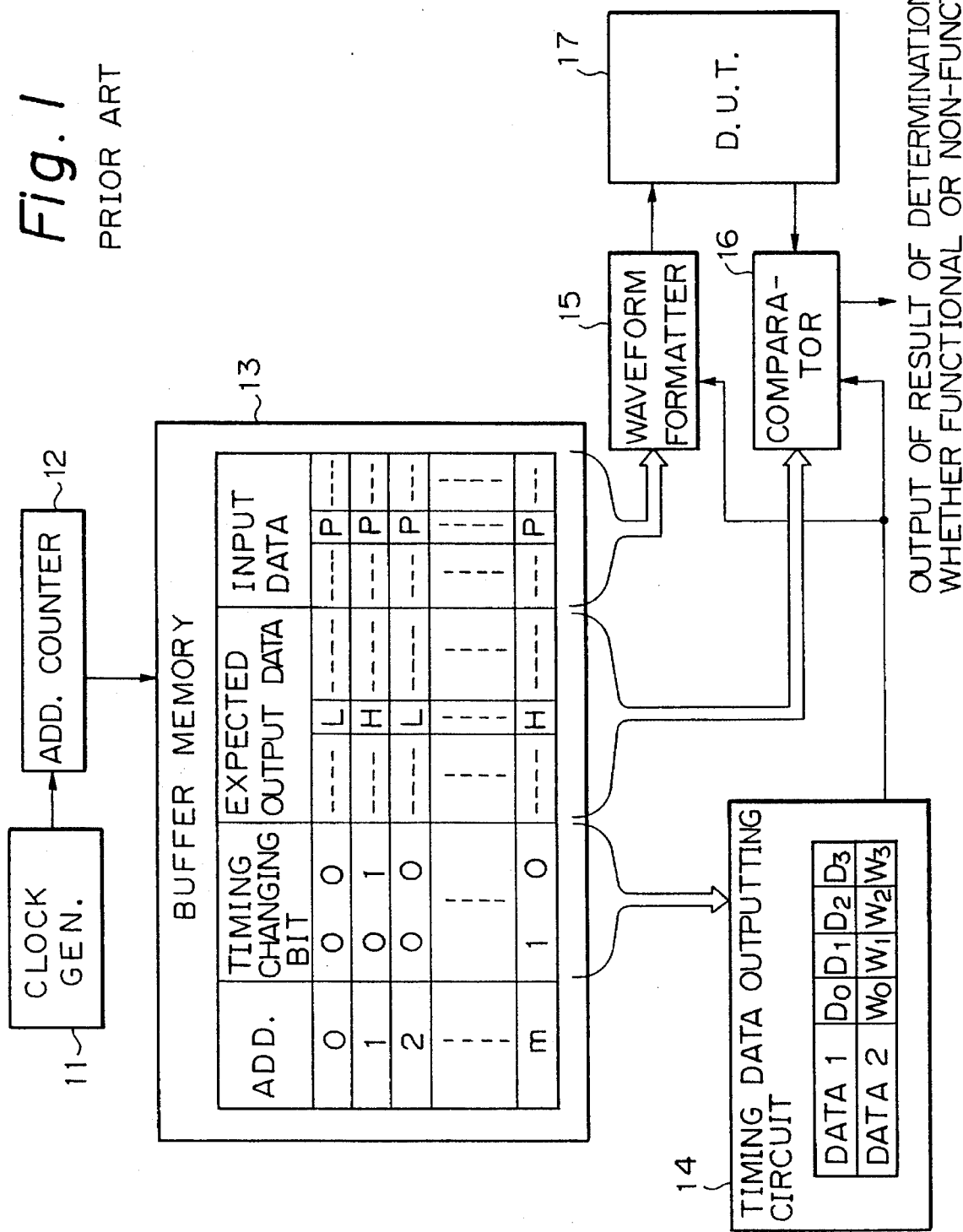
FIG. 1 is a block diagram illustrating the constitution of the LSI tester as an example of the prior art.
Figure 2:
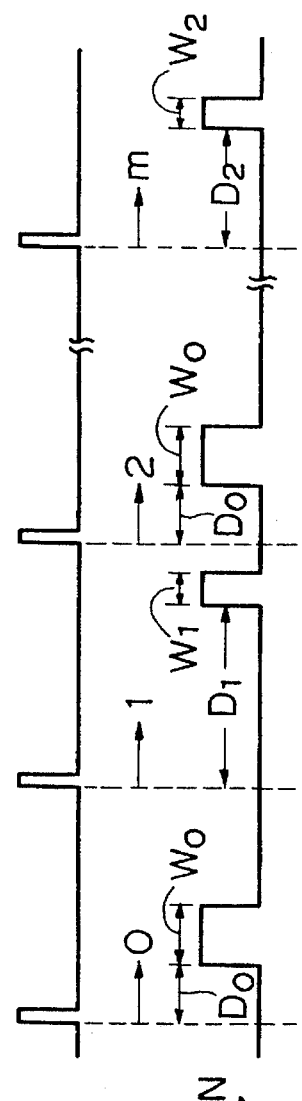
FIGS. 2a to 2c are waveform diagrams for explaining an operation of the apparatus shown in FIG. 1.

FIG. 1 is a schematic drawing of a constitution of a stored response type LSI tester, as an example of the prior art. In FIG. 1, 11 denotes a clock generator for generating a clock at predetermined time intervals, and 12 denotes an address counter, which carries out a sequential renewal of addresses in a subsequent buffer memory 13 upon receiving a clock.

In the buffer memory 13, an input data for testing a D.U.T. 17, an expected output data preset according to the input data, and timing changing bits for defining an application mode of the input data are stored in accordance with each of addresses 1 to m. The timing changing bits are constituted by two bits in the illustration of FIG. 1, and thus can define four application modes. The four application modes are stored as data in a timing data outputting circuit 14. In this case, the timing data outputting circuit 14 outputs two data 1 and 2, e.g., a delay data ($D_0$) and a pulse width data ($W_0$), in accordance with a combination of bits (0, 0) of a timing changing bit signal input from the buffer memory 13.

Reference 15 denotes a waveform formatter, which forms the input data from the buffer memory 13 into an actual input test pattern and applies that input test pattern to the D.U.T 17 at a timing designated by the timing data outputting circuit 14. Reference 16 denotes a comparator, which converts the expected output data from the buffer memory 13 into an actual expected output test pattern, compares a response signal output from the D.U.T. 17 in response to the above input test pattern with the expected output test pattern at a timing designated by the timing data outputting circuit 14, and indicates whether the D.U.T. 17 is functional or non-functional, based on a result of that comparison.

FIGS. 2a to 2c show an example of the waveform of the input test pattern according to the above apparatus of the prior art.

The above apparatus tests the D.U.T. in accordance with the timing changing bits preset with respect to each of addresses in the buffer memory 13, i.e., each of the test data. Namely, the mode of application of the test pattern to be employed is fixedly defined in accordance with the order in which the test pattern to be employed is stored in the buffer memory 13.

Accordingly, where a test pattern data stored in the nth order in the buffer memory 13 is employed and the test is carried out, test pattern data with an application mode different from the application mode defined in the nth order cannot be employed; namely when the test is carried out with an arbitrary test pattern, the mode of application of the test pattern cannot be changed.

To overcome this disadvantage, an enormous amount of timing changing bits must be prepared in the buffer memory; which bits define all of the modes of application of the test patterns required for testing the D.U.T. This means that the capacity of the buffer memory must be increased, and therefore, the following problems arise. First, since the size of the buffer memory per se is increased, a correspondingly increased memory space in a disc, a CPU memory or the like must be secured. Second, since the amount of information stored in the buffer memory is increased, it becomes difficult to control that information. Third, since more time is required for a change in writing into the buffer memory, more time is required for the test.

Preferred embodiments of the present invention will now be described in detail with reference to FIGS. 3 to 6.

Figure 3:
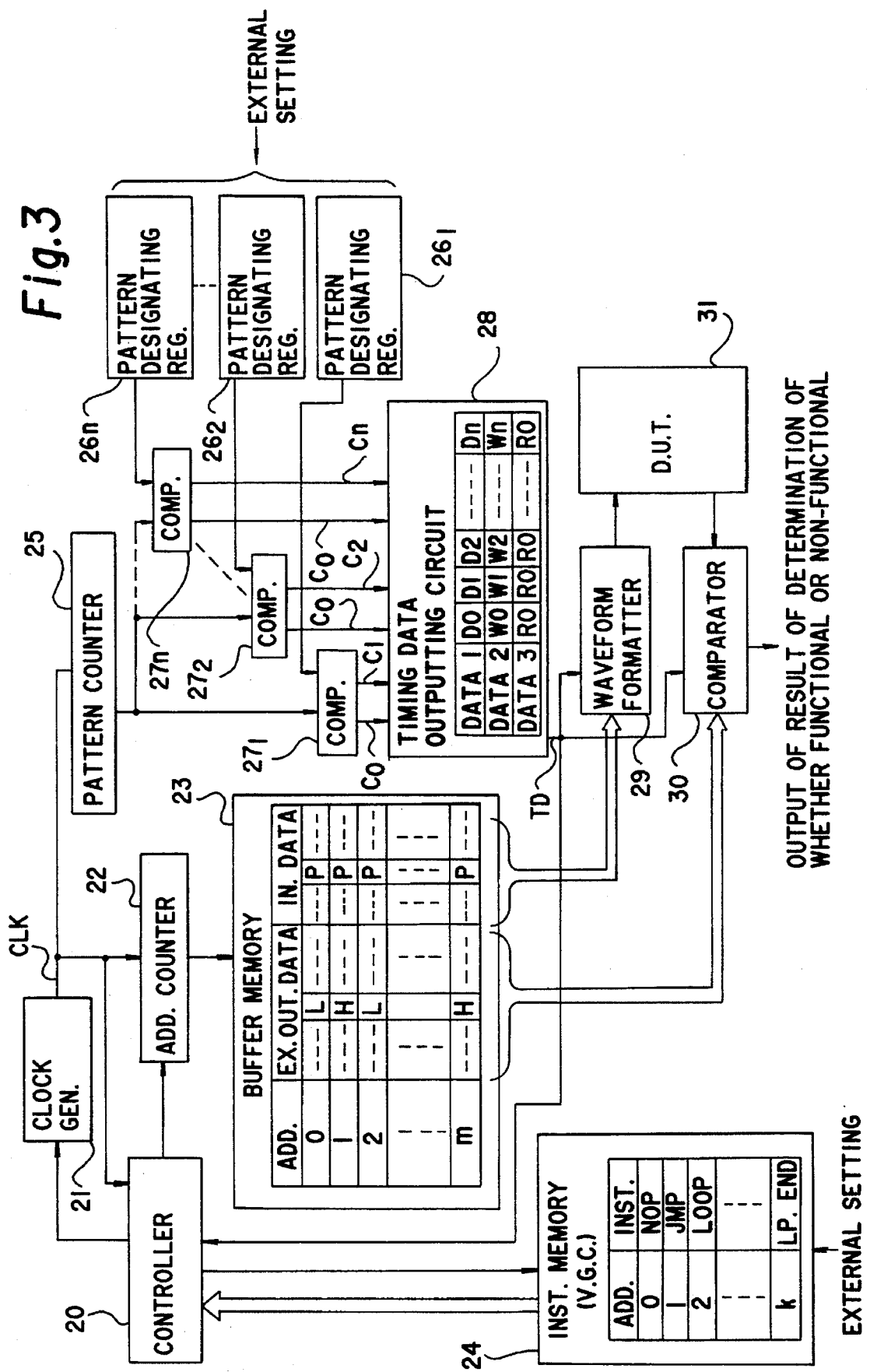
FIG. 3 is a block diagram illustrating the constitution of an LSI tester as an embodiment of the present invention.
Figure 4:
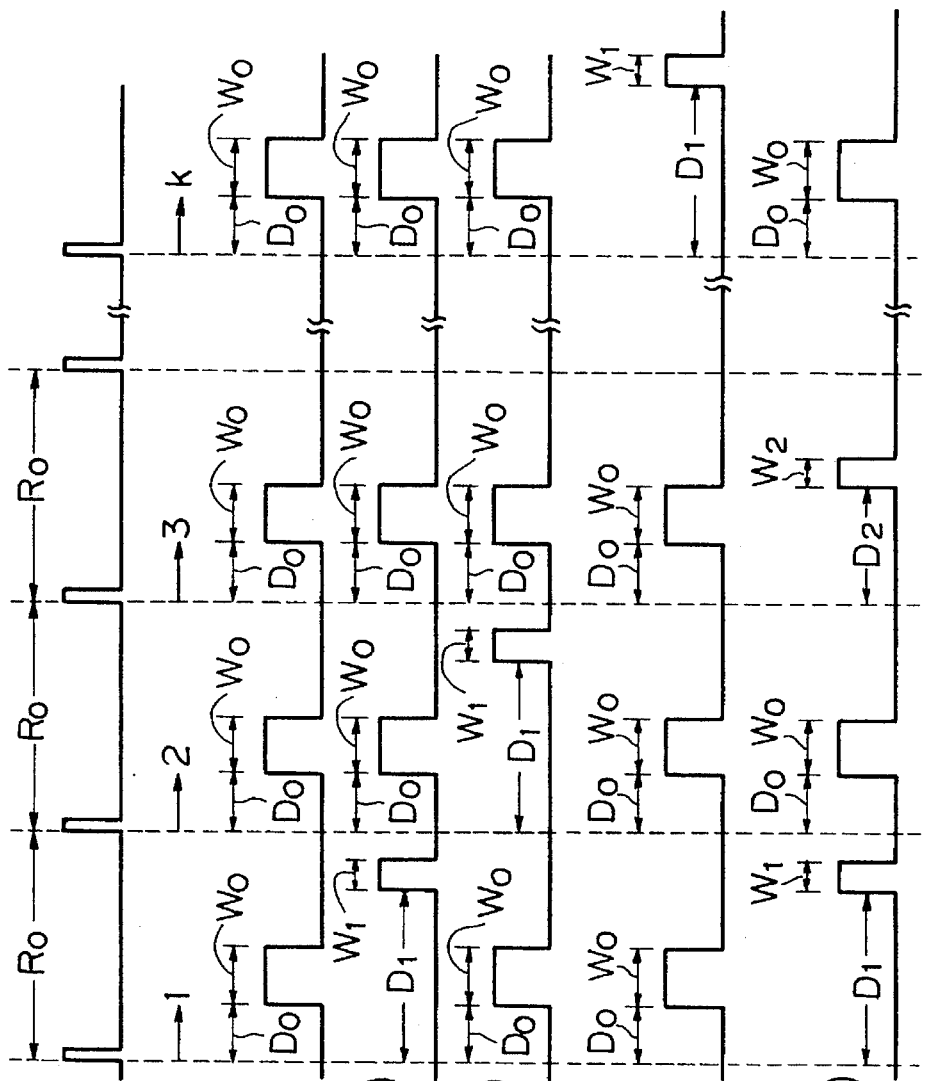
FIGS. 4a to 4g are waveform diagrams for explaining an operation of the apparatus shown in FIG. 3.

FIG. 3 illustrates a constitution of an LSI tester as an embodiment of the present invention.

In FIG. 3, 20 denotes a controller which reads instruction data preset in an instruction memory 24 in response to clocks CLK output from a clock generator 21 and decodes the content of the instruction data. The controller 20 also changes a rate of generation of the clocks CLK in the generator 21 in accordance with data 3 representing a rate information $R_0$ in a timing data outputting circuit 28. The clock generator 21 generates a train of clocks CLK at a variable generation rate; which rate is controlled by the controller 20. Reference 22 denotes an address counter, which is operated by the clocks CLK from the generator 21 and the counting operation of which is controlled by the controller 20. Namely, the address counter 22 not only counts the clocks CLK by a sequential increment, but also changes the counted value, which corresponds to address information in a buffer memory 23, in accordance with the content of the instruction data decoded by the controller 20.

In the buffer memory 23, input data (input test pattern data) for testing a D.U.T. 31 and corresponding expected output data (expected output test pattern data) are preset and stored with respect to each of the information addresses 1 to m. The buffer memory 23 feeds the input data and corresponding expected output data corresponding to the information address indicated by the content of the address counter 22 to a waveform formatter 29 and a comparator 30, respectively. In the present example, the buffer memory 23 has a capacity of 64 K, but the instruction memory 24, in which a variety of instruction data such as NOP (no operation), JMP (jump), LOOP, LP. END (loop end) and the like are preset and stored, has a capacity of 4 K. The instruction memory 24 functions as a sequence memory for controlling an address sequence in the buffer memory 23. The instruction data can be arbitrarily changed by an external input; which also applies to the buffer memory 23, with regard to the input data and corresponding expected output data.

Reference 25 denotes a pattern counter, which sequentially counts the clocks CLK output from the clock generator 21, one by one. References $26_1$, to $26_n$ denote pattern designating registers each having a designated value preset and stored therein in accordance with an external input. References $27_1$ and $27_n$ denote comparator provided for the registers $26_1$ to $26_n$, respectively. Each of the comparator $27_1$ to $27_n$ compares a designated value stored in the corresponding register $26_1$ to $26_n$ with the content of the counter 25 and, based on a result of the comparison, outputs either a control signal $C_0$ or a control signal $C_1$~$C_n$. For example, the comparator $27_1$, compares the content of the register $26_1$, i.e., the designated value, with the content of the counter 25, i.e., a counted value of the clocks CLK, outputs the control signal $C_0$ when these values do not coincide, and outputs the control signal $C_1$ when these values do coincide. In the same way, the comparator $27_2$ outputs the control signal $C_0$ when the designated value in the register $26_2$ and the counted value in the counter 25 do not coincide, and outputs the control signal C when these values do coincide. This comparing and outputting operation is also carried out by the comparators $27_3$~$27_n$.

In the timing data outputting circuit 28, a plurality of timing data, (n+1) data in the illustrated example, are preset and stored. Each of the timing data defines a mode of application of a test pattern data and consists of three data 1 to 3. Data 1, i.e., $D_0$~$D_n$, represents a delay data (see FIGS. 4c to 4g); data 2, i.e., $W_0$~$W_n$ represents a pulse width data; and data 3, i.e., $R_0$, represents the rate information for defining the rate of generation of the clocks CLK in the clock generator 21. The timing data outputting circuit 28 outputs the data ($D_0$, $W_0$, $R_0$) as timing data TD when the control signal $C_0$ output from one of the comparators $27_1$~$27_n$ is input thereto. The circuit 28 also outputs one of the data ($D_1$, $W_1$, $R_0$), ($D_2$, $W_2$, $R_0$), . . . , ($D_n$, $W_n$, $R_0$) as the timing data TD when the control signal $C_1$, $C_2$, . . . , or $C_n$ output from one of the comparators $27_1$~$27_n$ is input thereto.

The waveform formatter 29 forms the data input from the buffer memory 23 into an actual input test pattern and applies the input test pattern to the D.U.T. 31 at a timing designated by the circuit 28, i.e., at a timing indicated by the output timing data TD. The comparator 30 converts the expected output data from the buffer memory 23 into an actual expected output test pattern, compares a response signal output from the D.U.T. 31 in response to the above input test pattern with the expected output test pattern at a timing indicated by the timing data TD output from the circuit 28, and indicates whether the D.U.T. 31 is functional or non-functional, based on the result of the comparison.

Next, the operation of the apparatus according to the embodiment shown in FIG. 3 will be explained with reference to the waveform diagrams shown in FIGS. 4a to 4g. Note, to simplify the explanation, only two registers $26_1$ and $26_2$ and the corresponding comparators $27_1$ and $27_2$ are referred to in the following text.

Assuming that the rate information $R_0$ in the timing data outputting circuit 28 is preset to a constant value, then, the clock generator 21 outputs a train of clocks CLK at a rate of generation corresponding to the rate information $R_0$, as shown in FIG. 4a. When the clocks CLK are generated, the content of the pattern counter 25 is incremented sequentially one by one, as shown in FIG. 4b.

Assuming that the contents of both of the registers $26_1$ and $26_2$ are "0". In this case, since the content of the counter 25 and the contents of the registers do not coincide, both of the comparators $27_1$ and $27_2$ output the control signal $C_0$ to the timing data outputting circuit 28. As a result, the data ($D_0$, $W_0$, $R_0$) as the timing data TD are output from the circuit 28 to the waveform formatter 29, and accordingly, the formatter 29 applies the input test pattern as shown in FIG. 4c to the D.U.T. 31.

Alternatively, assuming that the content of the register $26_1$ is "1" and that of the register $26_2$ is "0". In the case, when the pattern counter 25 counts "1" the comparator $27_1$ detects a coincidence between the contents of the counter 25 and register $26_1$ and outputs the control signal $C_1$. As a result, the data ($D_1$, $W_1$, $R_0$) are output as the timing data TD from the circuit 28 to the waveform formatter 29, and accordingly, the formatter 29 applies the input test pattern as shown in FIG. 4d; to the D.U.T. 31. Compared with FIG. 4c, the mode of application of the test pattern is changed only when the first test pattern is employed and the test is carried out, i.e., only when the content of the pattern counter 25 is "1".

In the same way, assuming that the content of the register $26_1$ is "2" and that of the register $26_2$ is "0", the input test pattern as shown in FIG. 4e can be realized, and assuming that the content of the register $26_1$ is "k" and that of the register $26_2$ is "0", the input test pattern as shown in FIG. 4f can be realized.

Therefore, when the content of the register $26_1$ and that of the register $26_2$ are preset to different values, still another application mode can be realized. For example, assuming that the content of the register $26_1$ is "1" and that of the register $26_2$ is "3", when the first test pattern is employed and the test is carried out, i.e., when the content of the pattern counter 25 is "1", the comparator $27_1$ outputs the control signal $C_1$, so that the circuit 28 outputs the data ($D_1$, $W_1$, $R_0$) to the waveform formatter 29 as the timing data TD.

Alternatively, when the third test pattern is employed and the test is carried out, i.e., when the content of the pattern counter 25 is "3", the comparator $27_2$ outputs the control signal $C_2$, so that the circuit 28 outputs the data ($D_2$, $W_2$, $R_0$) to the waveform formatter 29 as the timing data TD. Also, when other test patterns except for the first and third test patterns are employed and the tests are carried out, i.e., when the content of the pattern counter 25 is not "1" or "3", both of the comparators $27_1$ and $27_2$ output the control signal $C_0$, so that the circuit 28 outputs the data ($D_0$, $W_0$, $R_0$) to the formatter 29 as the timing data TD, and thus the input test pattern as shown in FIG. 4g is applied to the D.U.T. 31.

As explained above, by suitably selecting the values preset in the pattern designating registers $26_1$ and $26_2$, the mode of application of the test pattern can be easily changed when the test is carried out with an arbitrary test pattern. Also, it is unnecessary to provide the buffer memory 23 with the timing changing bits, as in the prior art (see FIG. 1), a change in writing into the buffer memory for defining the application mode of the test pattern becomes unnecessary, and accordingly, an efficient test can be realized.

Although, in the above explanation, reference is made to two registers $26_1$ and $26_2$ and the corresponding comparators $27_1$ and $27_2$, it is apparent to those skilled in the art that a variety of modes of application of the test pattern can be realized by a suitable selection of the values to be preset in the registers $26_1$~$26_n$.

Figure 5:
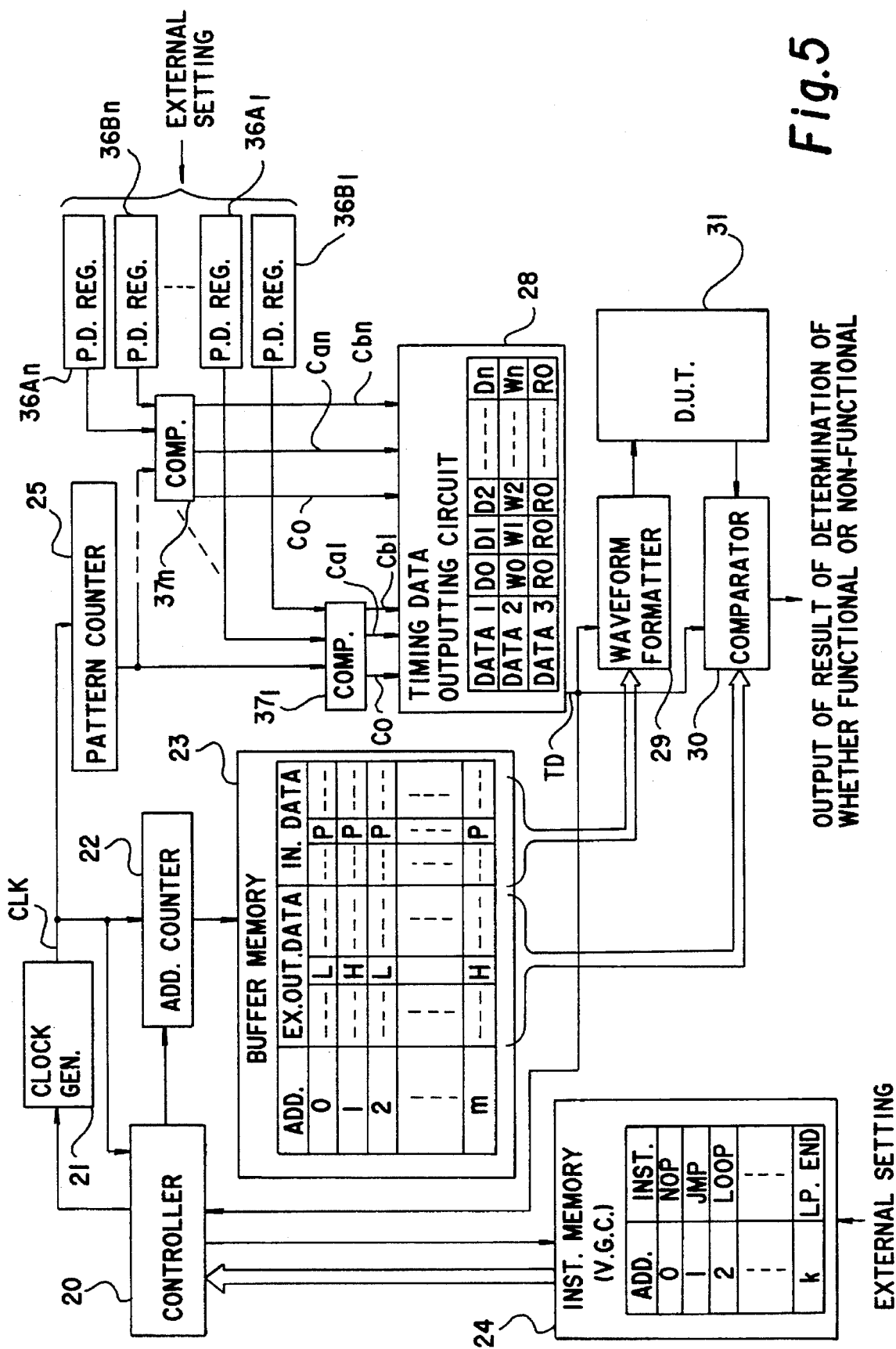
FIG. 5 is a block diagram illustrating the constitution of the LSI tester as another embodiment of the present invention.

FIG. 5 illustrates a construction of the LSI tester as another embodiment of the present invention.

The apparatus shown in FIG. 5 provides a window designation type LSI tester. Namely, in this apparatus the application mode can be changed in succession with respect to the test pattern data corresponding to addresses within a certain range in the buffer memory 23.

The differences between the apparatus of FIG. 5 and that of FIG. 3 are as follows; the registers $26_1$~$26_n$ are replaced by pairs of registers $36A_1$ and $36B_1$, $36A_2$ and $36B_2$, . . . , or $36A_n$ and $36B_n$, and the comparators $27_1$~$27_n$, are replaced by comparators $37_1$, $37_2$, . . . , or $37_n$. Other elements are the same as those shown in FIG. 3, and thus an explanation thereof will be omitted.

In the constitution of FIG. 5, each of the registers $36A_1$~$36A_n$ stores a designated value for indicating the beginning of a change in the mode of application of the test pattern, and each of the registers $36B_1$~$36B_n$ stores a designated value for indicating the end of the change. Each of the comparators $37_1$~$37_n$ compares designated values stored in the corresponding registers with the content of the counter 25, and based on a result of the comparison, outputs a control signal $C_0$, $C_{a1}$~$C_{an}$, or $C_{b1}$~$C_{bn}$. For example, the comparator $37_1$ outputs the control signal $C_{a1}$ when the contents of the counter 25 and that of the register $36A_1$ coincide, and outputs the control signal $C_{b1}$ when the content of the counter 25 and that of the register $36B_1$ coincide. When the content of the counter 25 and the content of the register $36A_1$ or $36B_1$ do not coincide, the comparator $37_1$ outputs the control signal $C_0$. As a result, the circuit 28 outputs the data ($D_0$, $W_0$, $R_0$) as the timing data TD in response to the control signal $C_0$. When one of the control signals $C_{a1}$~$C_{an}$ is input, the circuit 28 outputs one of the data ($D_1$, $W_1$, $R_0$), ($D_2$, $W_2$, $R_0$), . . . , and ($D_n$, $W_n$, $R_0$) as the timing data TD, and the timing data TD output in response to one of the control signals $C_{a1}$~$C_{an}$ is maintained until one of the control signals $C_{b1}$~$C_{bn}$ is input to the circuit 28. Namely, when one of the control signals $C_{b1}$~$C_{bn}$ is input, the circuit 28 outputs the original data ($D_0$, $W_0$, $R_0$) as the timing data TD.

In the following explanation, reference is made to only a pair of registers $36A_1$ and $36B_1$ and the corresponding comparator $37_1$, for simplicity. According to the apparatus shown in FIG. 5, the application mode ($D_0$, $W_0$, $R_0$) to ($D_1$, $W_1$, $R_0$) can be changed when the test pattern corresponding to the value preset in the register $36A_1$ is employed and the test is carried out, and the changed application mode ($D_1$, $W_1$, $R_0$) maintained until when the test pattern corresponding to the value preset in the register $36B_1$ is employed and the test is carried out.

FIGS. 6a to 6d illustrate examples of the waveform of the input test pattern according to the apparatus of FIG. 5. Note, in this explanation, reference is made to only a pair of registers $36A_1$ and $36B_1$ and the corresponding comparator $37_1$, for simplicity.

FIGS. 6a and 6b correspond to FIGS. 4a and 4b. FIG. 6c shows the input test pattern when the contents of both of the registers $36A_1$ and $36B_1$ are "0" and FIG. 6d shows the input test pattern when the content of the register $36A_1$ is "2" and the content of the register $36B_1$ is "4". As is obvious from a comparison between FIGS. 6c and 6d, the mode of application of the test pattern is kept in the changed application mode $(D_1, W_1, R_0)$ from when the second test pattern is employed and the test is carried out until the fourth test pattern is employed and the test is carried out.

Although, in the above explanation, reference is made to only a pair of registers $36A_1$ and $36A_2$ and the corresponding comparator $37_1$, it is apparent to those skilled in the art that a variety of modes of application of the test pattern, i.e., a variety of multi-window designation type tests can be realized by a suitably selection of the values to be preset in the registers $36A_1$~$36A_n$ and $36B_1$~$36B_n$.

As described above, according to the LSI tester of the present invention, by adding an external circuit or circuits having a simple constitution to a buffer memory the mode of application of the test pattern can be easily changed when the test is carried out with an arbitrary test pattern without increasing the capacity of the buffer memory. Also, the LSI tester according to this inventions makes a change in writing into the buffer memory unnecessary, and accordingly, enables a more efficient test.

Although the present invention has been disclosed and described by way of only two embodiments, it is apparent to those skilled in the art that other embodiments and modifications of the present invention are possible without departing from the spirit or essential features thereof.

I claim:

1. A test apparatus for determining whether an integrated circuit is functional or non-functional, said apparatus comprising:

a clock generator for generating a train of clocks with a variable rate of generation;

a first memory in which instruction data, including specific instructions indicating a loop control for repetitively applying a test pattern and a termination of the loop control, is preset and stored;

a second memory in which a plurality of input data and a corresponding plurality of expected output data are preset and stored;

a pattern counter, connected to said clock generator, for sequentially counting said clocks output from said clock generator, one by one;

a register circuit having a plurality of registers in each of which a selected designated value is preset and stored;

a comparing circuit, connected to said pattern counter and said register circuit, comparing each of said designated values in said register circuit with a value of said pattern counter and outputting control signals based on results of said comparison of each designated value and said counted clock value;

a timing data outputting circuit connected to said comparing circuit, said timing data outputting circuit defining a) a plurality of first timing data representing different time delays for a test pattern within a time interval defined by said variable rate, b) a plurality of second timing data representing different pulse widths, and c) a plurality of rate information indicating different time intervals defined by said variable rate, said timing data outputting circuit outputting one of said first timing data, one of said second timing data and one of said rate information in response to said control signals from said comparing circuit wherein said test pattern varies based on the first and second timing data and rate information output therefrom;

control means connected to said first memory, said second memory, said clock generator and said timing data outputting circuit, said control means for changing a rate of generation of said clocks based on said rate information output from the timing data outputting circuit, for reading said instruction data from said first memory in response to each of the clocks with the changed rate of generation, for causing said second memory to output said input data and said corresponding expected output data in accordance with the content of said instruction data, and for controlling the second memory to effect the loop control for repetitively outputting the input data and the corresponding expected output data and the termination of the loop control in accordance with said specific instructions; and a testing circuit connected between said second memory and said integrated circuit to be tested, for applying said input data from said second memory to said integrated circuit based on said first and second timing data and comparing a signal output from said integrated circuit in response to said input data with said expected output data, corresponding to said input data, from said second memory, wherein a result of a determination of whether said integrated circuit is functional or non-functional is indicated.

2. An apparatus as set forth in claim 1, wherein said control means comprises a controller for reading said instruction data from said first memory in response to each of said clocks output from said clock generator and decoding the content of said instruction data, and an address counter for changing an address information therein based on said decoded content and causing said second memory to output an input data indicated by said changed address information and a corresponding expected output data.

3. An apparatus as set forth in claim 1, wherein a capacity of said first memory is smaller than a capacity of said second memory.

4. An apparatus as set forth in claim 1, wherein said comparing circuit comprises a comparator and said register circuit comprises a corresponding register, said comparator comparing a designated value stored in the corresponding register with a value of said pattern counter and outputting a first control signal when a result of said comparison indicates a non-coincidence of said values and a second control signal when said result indicates a coincidence of said values.

5. An apparatus as set forth in claim 4, wherein said timing data outputting circuit outputs one of said second timing data in response to said second control signal and outputs said first timing data in response to said first control signal.

6. An apparatus as set forth in claim 1, wherein said comparing circuit comprises a plurality of comparators and said register circuit comprises a corresponding plurality of registers, each of said comparators comparing a designated value stored in a corresponding register with a value of said pattern counter and outputting a first control signal when a result of said comparison indicates a non-coincidence of said values and a second control signal when said result indicates a coincidence of said values.

7. An apparatus as set forth in claim 6, wherein said timing data outputting circuit outputs one of said second timing data in response to said second control signal and outputs said first timing data in response to said first control signal.

8. An apparatus as set forth in claim 1, wherein said comparing circuit comprises a comparator and said register circuit comprises a corresponding pair of registers, said comparator comparing a pair of designated values stored in the corresponding pair of registers with a value of said pattern counter and, based on said comparison, outputting a first control signal when said value of said pattern counter is out of the range defined said pair of designated values and a second control signal when said value is within said range.

9. An apparatus as set forth in claim 8, wherein said timing data outputting circuit continuously outputs said second timing data in response to said second control signal and continuously outputs said first timing data in response to said first control signal.

10. An apparatus as set forth in claim 1, wherein said comparing circuit comprises a plurality of comparators and said register circuit comprises a corresponding plurality of pairs of registers, each of said comparators comparing a pair of designated values stored in the corresponding pair of registers with a value of said counter and, based on said comparison, outputting a first control signal when said value of said counter is out of the range defined by said pair of designated values and a second control signal when said value is within said range.

11. An apparatus as set forth in claim 10, wherein said timing data outputting circuit continuously outputs one of said second timing data in response to said second control signal and continuously outputs said first timing data in response to said first control signal.

12. A test apparatus for determining whether an integrated circuit is functional or non-functional, said apparatus comprising:

a clock generator for generating a train of clocks with a variable rate of generation;

a first memory in which instruction data is preset and stored;

a second memory in which a plurality of input data and a corresponding plurality of expected output data are preset and stored;

a pattern counter for sequentially counting said clocks output from said clock generator, one by one;

a register circuit having a plurality of registers in each of which a selected designated value is preset and stored;

a comparing circuit, connected to said pattern counter and said register circuit, comparing each of said designated values in said register circuit with a value of said pattern counter and outputting control signals based on results of said comparison of each designated value and said counted clock value;

a timing data outputting circuit connected to said comparing circuit, said timing data outputting circuit defining a) a plurality of first timing data representing different first application modes of a test pattern within a time interval defined by said variable rate, b) a plurality of second timing data representing second application modes different from said first application modes, and c) a plurality of rate information indicating different time intervals defined by said variable rate, said timing data outputting circuit outputting one of said first timing data, one of said second timing data and one of said rate information in response to said control signals from said comparing circuit wherein said test pattern varies based on the first and second timing data and rate information output therefrom;

control means connected to said first memory, said second memory, said clock generator and said timing data outputting circuit, said control means for changing a rate of generation of said clocks based on said rate information output from the timing data outputting circuit, and for causing said second memory to output said input data and said corresponding expected output data in accordance with the content of said instruction data; and a testing circuit connected between said second memory and said integrated circuit to be tested, for applying said input data from said second memory to said integrated circuit based on said first and second timing data and comparing a signal output from said integrated circuit in response to said input data with said expected output data, corresponding to said input data, from said second memory, wherein a result of a determination of whether said integrated circuit is functional or non-functional is indicated.

* * * * *